(12) United States Patent
Moon et al.

(10) Patent No.: US 9,865,320 B2
(45) Date of Patent: Jan. 9, 2018

(54) ELECTRONIC DEVICE

(71) Applicant: SK hynix Inc., Icheon-Si (KR)

(72) Inventors: Jung-Hwan Moon, Icheon-si (KR);
Jeong-Myeong Kim, Icheon-si (KR);
June-Seo Kim, Icheon-Si (KR);
Sung-Joon Yoon, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 63 days.

(21) Appl. No.: 15/161,122

(22) Filed: May 20, 2016

(65) Prior Publication Data

US 2017/0154661 A1    Jun. 1, 2017

(30) Foreign Application Priority Data

Nov. 30, 2015    (KR) .......................... 10-2015-0168252

(51) Int. Cl.
| | |
|---|---|
| *G11C 11/16* | (2006.01) |
| *G06F 3/06* | (2006.01) |
| *G06F 12/0802* | (2016.01) |
| *G06F 13/16* | (2006.01) |
| *H01L 43/02* | (2006.01) |
| *H01L 43/08* | (2006.01) |
| *H01L 43/10* | (2006.01) |

(52) U.S. Cl.
CPC ............ *G11C 11/161* (2013.01); *G06F 3/061* (2013.01); *G06F 3/0656* (2013.01); *G06F 3/0679* (2013.01); *G06F 12/0802* (2013.01); *G06F 13/1673* (2013.01); *H01L 43/02* (2013.01); *H01L 43/08* (2013.01); *H01L 43/10* (2013.01); *G06F 2212/2024* (2013.01); *G06F 2212/60* (2013.01)

(58) Field of Classification Search
CPC ............................ G11C 11/16; G11C 11/1675
USPC ................................................. 365/158, 173
See application file for complete search history.

(56) References Cited

U.S. PATENT DOCUMENTS

| | | | |
|---|---|---|---|
| 7,280,389 B2 | 10/2007 | Guo | |
| 8,216,703 B2 | 7/2012 | Sun et al. | |
| 2005/0174702 A1* | 8/2005 | Gill | B82Y 25/00 360/324.2 |
| 2009/0053833 A1* | 2/2009 | Kikuchi | B82Y 10/00 438/3 |
| 2010/0232074 A1* | 9/2010 | MacHita | B82Y 10/00 360/324.11 |

(Continued)

FOREIGN PATENT DOCUMENTS

KR    10-2014-0131136 A    11/2014

*Primary Examiner* — Michael Tran (74) *Attorney, Agent, or Firm* — Perkins Coie LLP (57) ABSTRACT

This technology provides an electronic device. An electronic device in accordance with an implementation of this document may include a semiconductor memory, and the semiconductor memory may include free layer having a variable magnetization direction; a tunnel barrier layer formed over the free layer; a pinned layer formed over the tunnel barrier layer and having a pinned magnetization direction; an exchange coupling layer formed over the pinned layer; and a magnetic correction layer formed over the exchange coupling layer, wherein the magnetic correction layer comprises a first magnetic layer, a spacer layer and a second magnetic layer that are sequentially stacked, and the first magnetic layer has a saturation magnetization smaller than a saturation magnetization of the second magnetic layer.

19 Claims, 5 Drawing Sheets

(56) References Cited

U.S. PATENT DOCUMENTS

| | | | |
|---|---|---|---|
| 2011/0044096 A1* | 2/2011 | Li | G11C 11/16 |
| | | | 365/158 |
| 2011/0235217 A1* | 9/2011 | Chen | H01L 43/08 |
| | | | 360/324.2 |
| 2012/0205758 A1* | 8/2012 | Jan | H01L 29/66984 |
| | | | 257/421 |
| 2012/0292724 A1* | 11/2012 | Lim | H01L 43/08 |
| | | | 257/421 |
| 2013/0069182 A1* | 3/2013 | Ohsawa | H01L 29/82 |
| | | | 257/421 |
| 2014/0015076 A1* | 1/2014 | Gan | H01L 43/08 |
| | | | 257/421 |
| 2014/0050019 A1* | 2/2014 | Lee | G11C 11/16 |
| | | | 365/158 |
| 2014/0061828 A1* | 3/2014 | Lim | H01L 43/08 |
| | | | 257/421 |
| 2014/0284742 A1 | 9/2014 | Sawada et al. | |
| 2015/0048464 A1* | 2/2015 | Park | G11C 11/161 |
| | | | 257/421 |
| 2015/0123224 A1* | 5/2015 | Prejbeanu | G11C 11/16 |
| | | | 257/421 |
| 2016/0043300 A1* | 2/2016 | Kim | H01L 43/08 |
| | | | 711/125 |
| 2016/0276006 A1* | 9/2016 | Ralph | G11C 11/18 |

* cited by examiner

ELECTRONIC DEVICE

CROSS-REFERENCE TO RELATED APPLICATION

This patent document claims priority of Korean Patent Application No. 10-2015-0168252, entitled "ELECTRONIC DEVICE" and filed on Nov. 30, 2015, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such electronic devices include electronic devices which can store data using a characteristic switched between different resistant states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device, in which an electronic device includes a semiconductor memory which can improve characteristics of a variable resistance element.

In one aspect, an electronic device may include a semiconductor memory, wherein the semiconductor memory may include: a free layer having a variable magnetization direction; a tunnel barrier layer formed over the free layer; a pinned layer formed over the tunnel barrier layer and having a pinned magnetization direction; an exchange coupling layer formed over the pinned layer; and a magnetic correction layer formed over the exchange coupling layer, wherein the magnetic correction layer comprises a first magnetic layer, a spacer layer and a second magnetic layer that are sequentially stacked, and the first magnetic layer has a saturation magnetization smaller than a saturation magnetization of the second magnetic layer.

The first magnetic layer and the second magnetic layer may have a pinned magnetization direction. The first magnetic layer may have the same magnetization direction as the second magnetic layer. The pinned layer may have a magnetization direction fixed to a first direction, and the magnetic correction layer may have a magnetization direction fixed to a second direction different from the first direction. An SF (synthetic ferromagnet) structure exists between the first magnetic layer and the second magnetic layer, and a SAF (synthetic anti-ferromagnet) structure exists between the magnetic correction layer and the pinned layer. The spacer layer may include the same material as the exchange coupling layer.

The electronic device may further comprising a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further comprising a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further comprising a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further comprising a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further comprising a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In another aspect, an electronic device may include: a free layer having a variable magnetization direction; a tunnel barrier layer formed over the free layer; a pinned layer formed over the tunnel barrier layer and having a magnetization direction fixed to a first direction; an exchange coupling layer formed over the pinned layer; and a magnetic correction layer formed over the exchange coupling layer, wherein the magnetic correction layer comprises a plurality of magnetic layers, and each of the plurality of magnetic layer having a magnetization direction fixed to a second direction different from the first direction.

The magnetic correction layer may further include a spacer layer interposed among the plurality of magnetic layers. The spacer layer may include the same material as the exchange coupling layer.

Each of the plurality of magnetic layers may have a different saturation magnetization from each other, and a saturation magnetization of the magnetic correction layer may have a linear profile in a vertical direction. The saturation magnetization of the magnetic correction layer may vary depending on a distance between the magnetic correction layer and the pinned layer. The saturation magnetization of the magnetic correction layer may be decreased as a distance between the magnetic correction layer and the pinned layer decreases, and may be increased as the distance increases. An SF (synthetic ferromagnet) structure exists among the plurality of magnetic layers, and a SAF (synthetic anti-ferromagnet) structure exists between the magnetic correction layer and the pinned layer. The plurality of magnetic layers may include a first magnetic layer and a second magnetic layer formed over the first magnetic layer, and the second magnetic layer may have a saturation magnetization greater than a saturation magnetization of the first magnetic layer.

These and other aspects, implementations and associated advantages are described in greater detail in the drawings, the description and the claims.

DETAILED DESCRIPTION

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Following implementations of the present disclosure are to provide a semiconductor memory including a variable resistance element having an improved performance and an electronic device including the same. Here, the variable resistance element may mean an element capable of being switched between different resistance states in response to the applied bias (for example, a current or voltage). Therefore, the variable resistance element having an improved performance may mean the variable resistance element having an improved switching characteristic between different resistance states.

Figure 1:
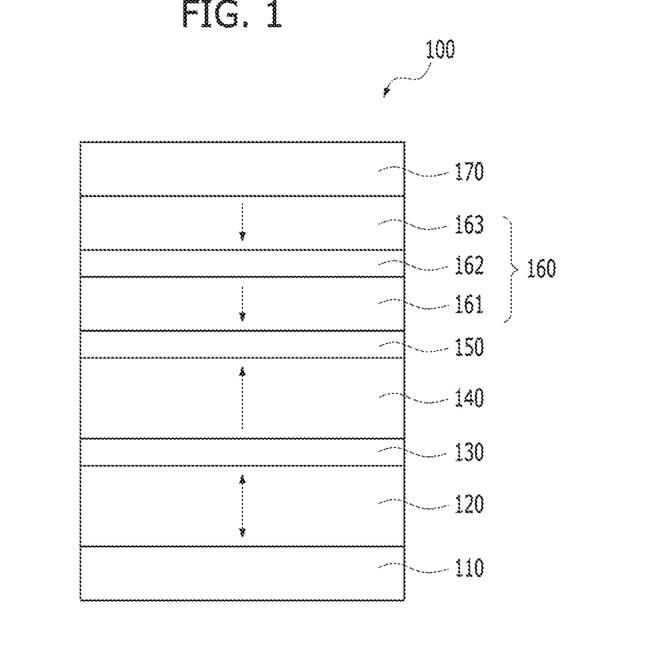
FIG. 1 is a cross-sectional view illustrating an exemplary variable resistance element in accordance with an implementation of the present disclosure.

FIG. 1 is a cross-sectional view illustrating an exemplary variable resistance element in accordance with an implementation of the present disclosure.

As shown in FIG. 1, a variable resistance element 100 may include an MTJ (Magnetic Tunnel Junction) structure including a free layer 120 having a variable magnetization direction, a pinned layer 140 having a pinned magnetization direction, and a tunnel barrier layer 130 interposed between the free layer 120 and the pinned layer 140.

In the MTJ structure, since the magnetization direction of the free layer 120 is variable, the free layer 120 may practically store data according to its magnetization direction. Therefore, the free layer 120 may be referred to as a storage layer. The magnetization direction of the free layer 120 may be changed by spin transfer torque. Since the magnetization direction of the pinned layer 140 is pinned, the pinned layer 140 may be compared with the free layer 120 and be referred to as a reference layer. The tunnel barrier layer 130 may serve to change the magnetization direction of the free layer 120 by tunneling of electrons. The free layer 120 and the pinned layer 140 may have a magnetization direction perpendicular to a surface of each layer. As indicated by arrows in drawings, the magnetization direction of the free layer 120 may be changed between a downward direction and an upward direction, and the magnetization direction of the pinned layer 140 may be fixed to an upward direction, for example, a first direction.

In response to a voltage or current applied to the variable resistance element 100, the magnetization direction of the free layer 120 may be changed so as to be parallel or anti-parallel to the magnetization direction of the pinned layer 140. As a result, the variable resistance element 100 may be switched between a low resistance state and a high resistance state to store different data. That is, the variable resistance element 100 may function as a memory cell.

Each of the free layer 120 and the pinned layer 140 may have a single-layered structure or a multi-layered structure including a ferromagnetic material. In some implementations, each of the free layer 120 and the pinned layer 140 may include an alloy of which a main component is Fe, Ni or Co, such as a Co—Fe—B alloy, a Co—Fe—B—X alloy (Here, X may be or include Al, Si, Ti, V, Cr, Ni, Ga, Ge, Zr, Nb, Mo, Pd, Ag, Hf, Ta, W or Pt.), an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, an Fe—Pd alloy, a Co—Pd alloy, a Co—Pt alloy, an Fe—Ni—Pt alloy, a Co—Fe—Pt alloy, or a Co—Ni—Pt alloy, etc. Each of the free layer 120 and the pinned layer 140 may include a stack structure of Co/Pt or Co/Pd, etc. or an alternate stack structure of a magnetic material and a non-magnetic material. The tunnel barrier layer 130 may include an insulating oxide, for example, MgO, CaO, SrO, TiO, VO, or NbO, etc.

In some implementations, the variable resistance element 100 in accordance with this implementation may further include one or more additional layers performing various functions to improve a characteristic of the MTJ structure. For example, one implementation of the variable resistance element includes an under layer 110, an exchange coupling layer 150, a magnetic correction layer 160 and a capping layer 170 as the additional layers. However, the present disclosure is not limited thereto and other implementations are also possible.

The under layer 110 may be used to improve a perpendicular magnetic anisotropy or a crystallinity of the layer disposed over the under layer 110, for example, the free layer 120. The under layer 110 may have a single-layered or a multi-layered structure including various conductive materials such as a metal, or metal nitride, etc.

The exchange coupling layer 150 may be interposed between the magnetic correction layer 160 and the pinned layer 140 and be used to provide an interlayer exchange coupling therebetween. The exchange coupling layer 150 may include a metallic non-magnetic material such as Cr, Ru, Ir, or Rh, etc.

The magnetic correction layer 160 may be used to offset or reduce an influence of a stray field generated by the pinned layer 140. In this case, the influence of the stray filed of the pinned layer 140 on the free layer 120 is decreased so that a bias magnetic field in the free layer 120 can be reduced. As a result, thermal stability and a magnetic characteristic of the pinned layer 140 can be improved.

The magnetic correction layer 160 may include a plurality of magnetic layers 161 and 163 and a spacer layer 162 interposed between the plurality of magnetic layers 161 and 163. In some implementations, the magnetic correction layer 160 may have a multi-stack structure where the first magnetic layer 161, the spacer layer 162 and the second magnetic layer 163 are sequentially stacked. Each of the first magnetic layer 161 and the second magnetic layer 163 may include an alloy of which a main component is Fe, Ni or Co, such as a Co—Fe—B alloy, a Co—Fe—B—X alloy (Here, X may be or include Al, Si, Ti, V, Cr, Ni, Ga, Ge, Zr, Nb, Mo, Pd, Ag, Hf, Ta, W or Pt.), an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, an Fe—Pd alloy, a Co—Pd alloy, a Co—Pt alloy, an Fe—Ni—Pt alloy, a Co—Fe—Pt alloy, or a Co—Ni—Pt alloy, etc. In some implementations, each of the first magnetic layer 161 and the second magnetic layer 163 may include a stack structure of Co/Pt or Co/Pd, etc. The spacer layer 162 may be used to provide an exchange coupling between the first magnetic layer 161 and the second magnetic layer 163. The spacer layer 162 may include the same material as the exchange coupling layer 150. For example, the spacer layer 162 may include a metallic non-magnetic material such as Cr, Ru, Ir, or Rh, etc.

The first magnetic layer 161 and the second magnetic layer 163 may have a pinned magnetization direction. Here, magnetization directions of the first magnetic layer 161 and the second magnetic layer 163 may be the same as each other. For example, as shown in drawings, the first magnetic layer 161 and the second magnetic layer 163 may have a downward magnetization direction such as the magnetization direction fixed to a second direction opposite to the first direction. Therefore, the magnetic correction layer 160 may have a magnetization direction anti-parallel to the magnetization direction of the pinned layer 140. Accordingly, an SF (synthetic ferromagnet) structure may exist in the magnetic correction layer 160 itself, for example, between the first magnetic layer 161 and the second magnetic layer 163. In some implementations, a synthetic anti-ferromagnet (SAF) structure may exist between the magnetic correction layer 160 and the pinned layer 140. A relationship of the magnetization directions of the pinned layer 140 and the magnetic correction layer 160 described above is to facilitate control of characteristics according to a saturation magnetization in the magnetic correction layer 160 which will be described following the below.

In the magnetic correction layer 160, each of the plurality of magnetic layers 161 and 163 may have a different saturation magnetization Ms from each other, and the saturation magnetization in a vertical direction in the magnetic correction layer 160 may have a linear profile. In some implementations, the saturation magnetization of the magnetic correction layer changes depending on a distance between the magnetic correction layer and the pinned layer. For example, the saturation magnetization of the magnetic correction layer 160 may be decreased as is the position of the magnetic correction layer 160 is closer to the pinned layer 140, and be increased as the position of the magnetic correction layer 160 is further away from the pinned layer 140. In some implementation, in the magnetic correction layer 160, the first magnetic layer 161 and the second magnetic layer 163 may have different saturation magnetizations from each other, and the saturation magnetization of the first magnetic layer 161 may be smaller than that of the second magnetic layer 163. Since the first magnetic layer 161 in the magnetic correction layer 160 has a relatively small saturation magnetization, it is possible to reduce the stray field in the pinned layer 140. Here, as the saturation magnetization in the first magnetic layer 161 is decreased in order to reduce the stray field in the pinned layer 140, the stray field in the free layer 120 may be shifted so as to deteriorate characteristics. In order to prevent this problem, the second magnetic layer 163 may have the saturation magnetization larger than that of the first magnetic layer 161. Since the saturation magnetization of the first magnetic layer 161 adjacent to the pinned layer 140 is smaller than that of the second magnetic layer 163, the stray field in the pinned layer 140 can be reduced and the shift of the stray field in the free layer 120 can be prevented.

The capping layer 170 may function as a hard mask for patterning the variable resistance element 100. The capping layer 170 may include various conductive materials such as a metal, etc.

As described above, the variable resistance element 100 in accordance with the implementation may include the magnetic correction layer 160 including the plurality of magnetic layers 161 and 163 having a different saturation magnetization from each other, and thereby improving characteristics such as thermal stability of the variable resistance element 100.

In accordance with implementation, it is possible to improve characteristics of the variable resistance element and thus, improve characteristics of the semiconductor memory including the variable resistance element and the electronic device including the semiconductor device.

The variable resistance element in accordance with the implementations of the present disclosure, for example, the variable resistance element 100 of FIG. 1 may be provided in plural to form a cell array. The cell array may include various components such as lines, elements, etc. to drive the variable resistance element 100. This will be exemplarily described with reference to FIGS. 2 and 3.

Figure 2:
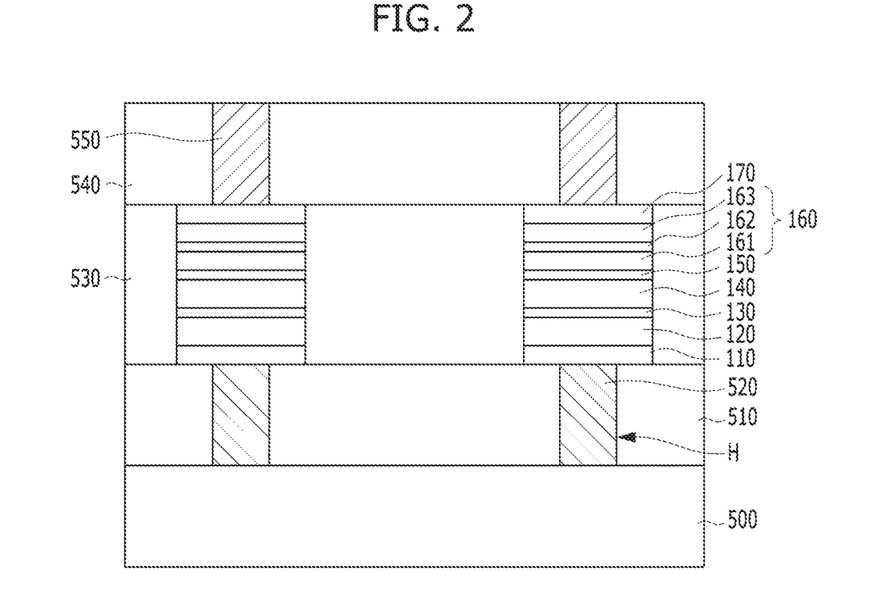
FIG. 2 is a cross-sectional view illustrating an exemplary memory device and a method for fabricating the same in accordance with an implementation of the present disclosure.

FIG. 2 is a cross-sectional view illustrating a memory device and a method for fabricating the same in accordance with an implementation of the present disclosure.

Referring to FIG. 2, the memory device of this implementation may include a substrate 500, a lower contact 520, a variable resistance element 100 and an upper contact 550. The substrate 500 may include a specific structure (not shown) which is required, for example, a transistor controlling an access to the variable resistance element 100. The lower contact 520 may be disposed over the substrate 500, and couple a lower end of the variable resistance element 100 with a portion of the substrate 500, for example, a drain of the transistor. The upper contact 550 may be disposed over the variable resistance element 100, and couple an upper end of the variable resistance element 100 with a certain line (not shown), for example, a bit line.

The above memory device may be fabricated by following processes.

First, the substrate 500 in which the transistor is formed may be provided, and then, a first interlayer dielectric layer 510 may be formed over the substrate 500. Subsequently, the lower contact 520 may be formed by selectively etching the first interlayer dielectric layer 510 to form a hole exposing a portion of the substrate 500 and filling the hole with a conductive material. Then, the variable resistance element 100 may be formed by forming material layers for the variable resistance element 100 over the first interlayer dielectric layer 510 and the lower contact 520, and selectively etching the material layers. A second interlayer dielectric layer 530 may be formed by filling spaces among the variable resistance elements 100 with an insulating material. Then, a third interlayer dielectric layer 340 may be formed over the variable resistance element 100 and the second interlayer dielectric layer 530, and then, the upper contact 550 penetrating through the third interlayer dielectric layer 530 and coupled to the upper end of the variable resistance element 100 may be formed.

In the memory device of this implementation, all layers included in the variable resistance element 100 may have sidewalls aligned with each other. This is because the variable resistance element 100 may be formed by an etching process using a single mask.

However, unlike the implementation of FIG. 2, a portion of the variable resistance element 100 and a remaining portion of the variable resistance element 100 may be patterned individually. This will be exemplarily shown in FIG. 3.

Figure 3:
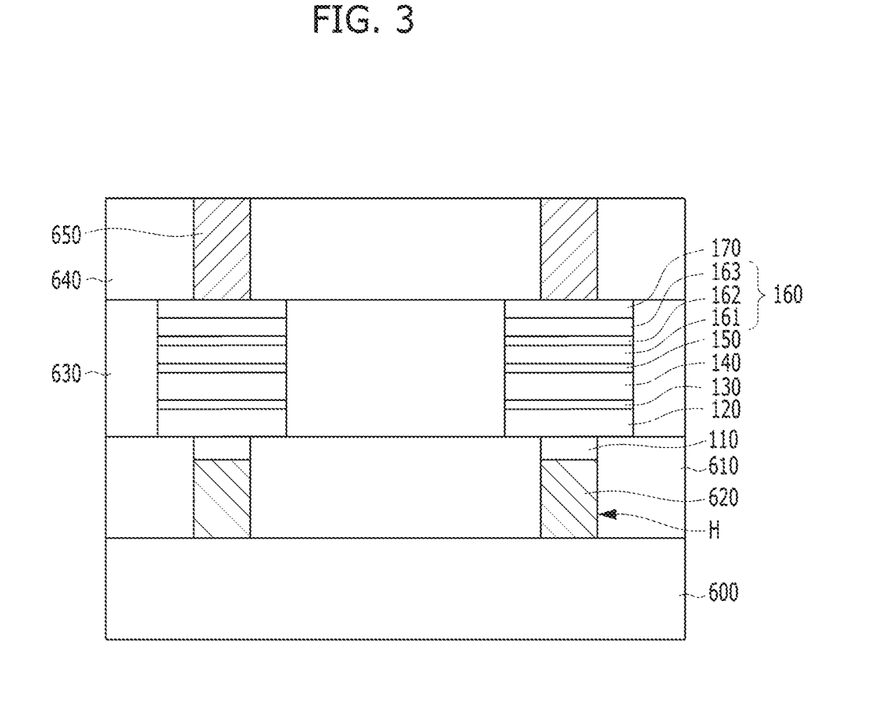
FIG. 3 is a cross-sectional view illustrating an exemplary memory device and a method for fabricating the same in accordance with another implementation of the present disclosure.

FIG. 3 is a cross-sectional view illustrating a memory device and a method for fabricating the same in accordance with another implementation of the present disclosure. Differences from the implementation of FIG. 2 will be mainly described.

Referring to FIG. 3, in the memory device of this implementation, a portion of the variable resistance element 100, for example, an under layer 110 may have a sidewall which is not aligned with sidewalls of remaining layers of the variable resistance element 100. The under layer 110 may have a sidewall which is aligned with a sidewall of a lower contact 620.

The above memory device may be fabricated by following processes.

First, a first interlayer dielectric layer 610 may be formed over a substrate 600, and then, a hole H exposing a portion of the substrate 600 may be formed by selectively etching the first interlayer dielectric layer 610. Then, the lower contact 620 filled in a lower portion of the hole H may be formed. Specifically, the lower contact 620 may be formed by forming a conductive material covering a resultant structure in which the hole H is formed, and removing a portion of the conductive material by an etch back process, etc, until the conductive material has a target height. Then, the under layer 110 filled in a remaining space of the hole H in which the lower contact 620 is formed may be formed. Specifically, the under layer 110 may be formed by forming a material layer which includes a light metal and covers a resultant structure in which the lower contact 620 is formed, and performing a planarization process, for example, a CMP (Chemical Mechanical Polishing) process until a top surface of the first interlayer dielectric layer 610 is exposed. Then, the remaining portion of the variable resistance element 100 may be formed by forming material layers for the remaining layers of the variable resistance element 100, except for the under layer 110, and selectively etching the material layers. Following processes are substantially same as the implementation of FIG. 2.

In this implementation, since a thickness to be etched for forming the variable resistance element 100 decreases, a difficulty of an etching process may be reduced.

Also, in this implementation, a case that the under layer 110 is filled in the hole H is described. However, other implementations are also possible. For example, another portion of the variable resistance element 100 may be further filled in the hole H.

The semiconductor memory in accordance with the implementation of the present disclosure may be applied to diverse electronic devices or systems. FIGS. 4 to 8 show some examples of electronic devices or systems that can implement the semiconductor memory disclosed herein.

Figure 4:
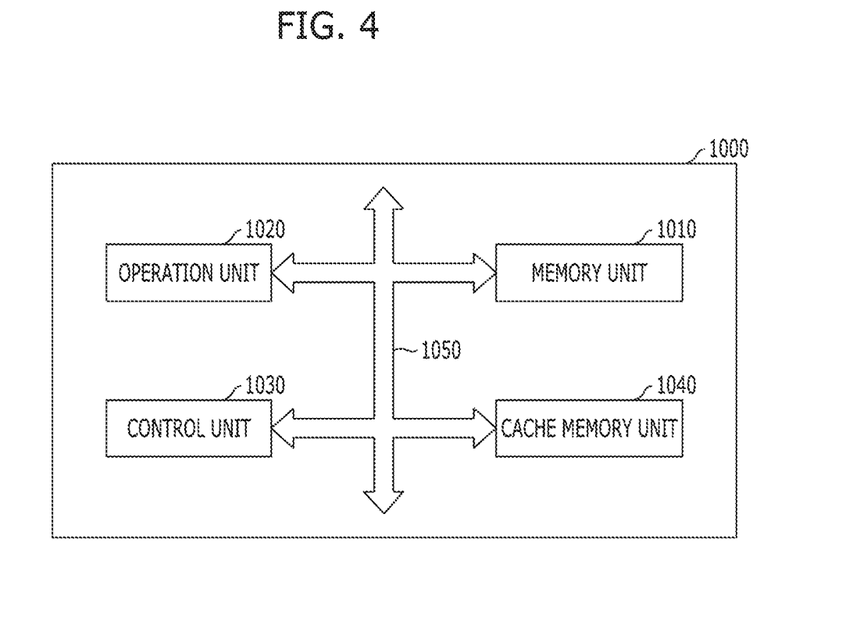
FIG. 4 is an example of configuration diagram of a microprocessor implementing memory circuitry based on the disclosed technology.

Referring to FIG. 4, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. The memory unit 1010 may include semiconductor memory which includes a variable resistance element. The variable resistance element may include a free layer having a variable magnetization direction, a tunnel barrier layer formed over the free layer, a pinned layer formed over the tunnel barrier layer and having a pinned magnetization direction, an exchange coupling layer formed over the pinned layer, and a magnetic correction layer formed over the exchange coupling layer. The magnetic correction layer may include a first magnetic layer, a spacer layer and a second magnetic layer which are sequentially stacked, and a saturation magnetization of the first magnetic layer may be smaller than that of the second magnetic layer. Thereby improving characteristics such as thermal stability of the variable resistance element. Therefore, the semiconductor memory with improved operation characteristics may be provided. Through this, the memory unit 1010 and the microprocessor 1000 may have improved reliability.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 5:
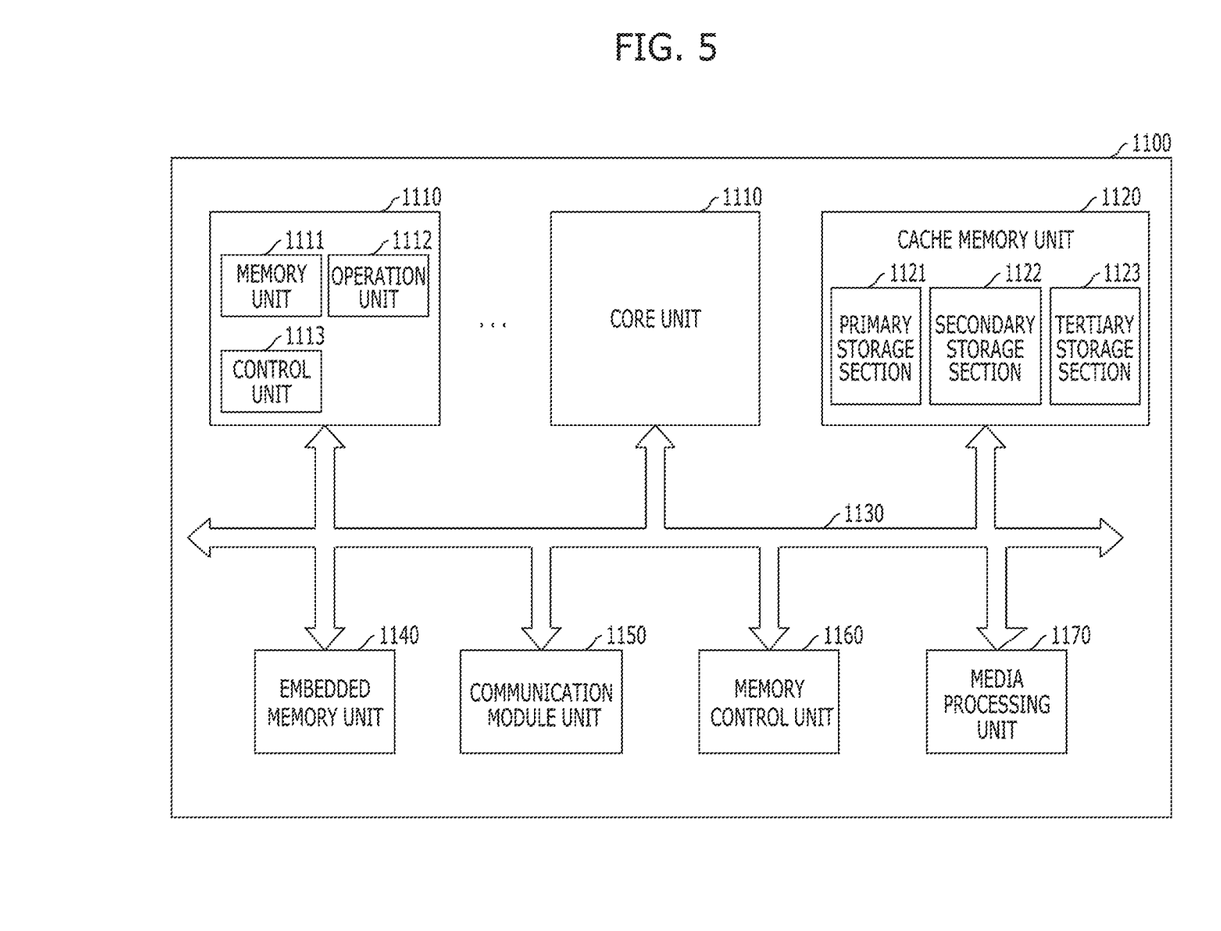
FIG. 5 is an example of configuration diagram of a processor implementing memory circuitry based on the disclosed technology.

FIG. 5 is an example of configuration diagram of a processor implementing memory circuitry based on the disclosed technology.

Referring to FIG. 5, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include semiconductor memory which includes a variable resistance element. The variable resistance element may include a free layer having a variable magnetization direction, a tunnel barrier layer formed over the free layer, a pinned layer formed over the tunnel barrier layer and having a pinned magnetization direction, an exchange coupling layer formed over the pinned layer, and a magnetic correction layer formed over the exchange coupling layer. The magnetic correction layer may include a first magnetic layer, a spacer layer and a second magnetic layer which are sequentially stacked, and a saturation magnetization of the first magnetic layer may be smaller than that of the second magnetic layer. Thereby improving characteristics such as thermal stability of the variable resistance element. Therefore, the semiconductor memory with improved operation characteristics may be provided. Through this, the cache memory unit 1120 and the processor 1100 may have improved reliability.

Although it was shown in FIG. 5 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MIVIC), an embedded MIVIC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 6:
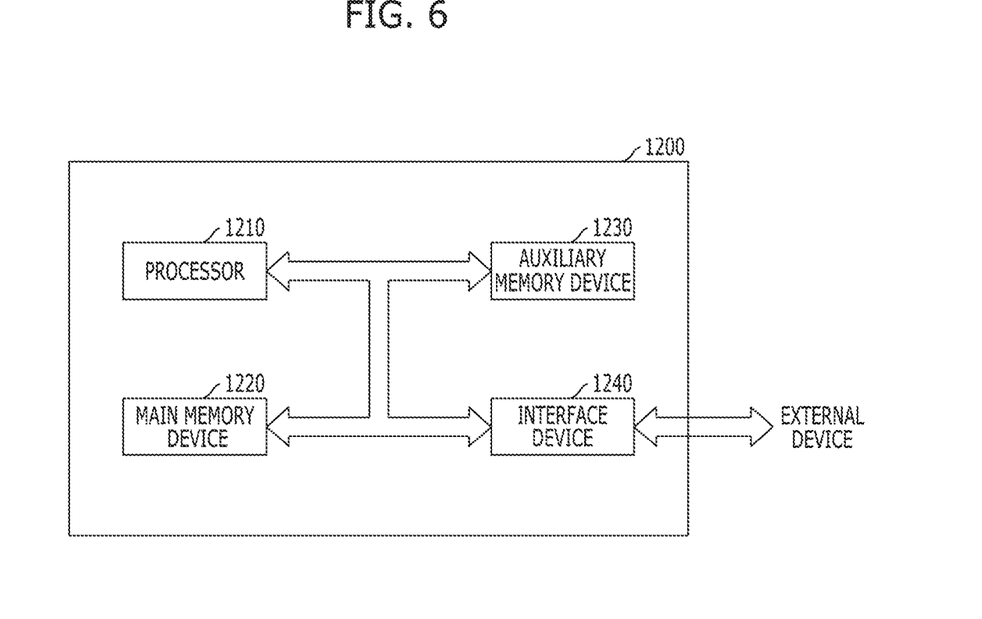
FIG. 6 is an example of configuration diagram of a system implementing memory circuitry based on the disclosed technology.

FIG. 6 is an example of configuration diagram of a system implementing memory circuitry based on the disclosed technology.

Referring to FIG. 6, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include semiconductor memory which includes a variable resistance element. The variable resistance element may include a free layer having a variable magnetization direction, a tunnel barrier layer formed over the free layer, a pinned layer formed over the tunnel barrier layer and having a pinned magnetization direction, an exchange coupling layer formed over the pinned layer, and a magnetic correction layer formed over the exchange coupling layer. The magnetic correction layer may include a first magnetic layer, a spacer layer and a second magnetic layer which are sequentially stacked, and a saturation magnetization of the first magnetic layer may be smaller than that of the second magnetic layer. Thereby improving characteristics such as thermal stability of the variable resistance element. Therefore, the semiconductor memory with improved operation characteristics may be provided. Through this, the main memory device 1220 and the system 1200 may have improved reliability.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include semiconductor memory which includes a variable resistance element. The variable resistance element may include a free layer having a variable magnetization direction, a tunnel barrier layer formed over the free layer, a pinned layer formed over the tunnel barrier layer and having a pinned magnetization direction, an exchange coupling layer formed over the pinned layer, and a magnetic correction layer formed over the exchange coupling layer. The magnetic correction layer may include a first magnetic layer, a spacer layer and a second magnetic layer which are sequentially stacked, and a saturation magnetization of the first magnetic layer may be smaller than that of the second magnetic layer. Thereby improving characteristics such as thermal stability of the variable resistance element. Therefore, the semiconductor memory with improved operation characteristics may be provided. Through this, the auxiliary memory device 1230 and the system 1200 may have improved reliability.

Also, the auxiliary memory device 1230 may further include a data storage system (see the reference numeral 1300 of FIG. 7) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 7) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 7:
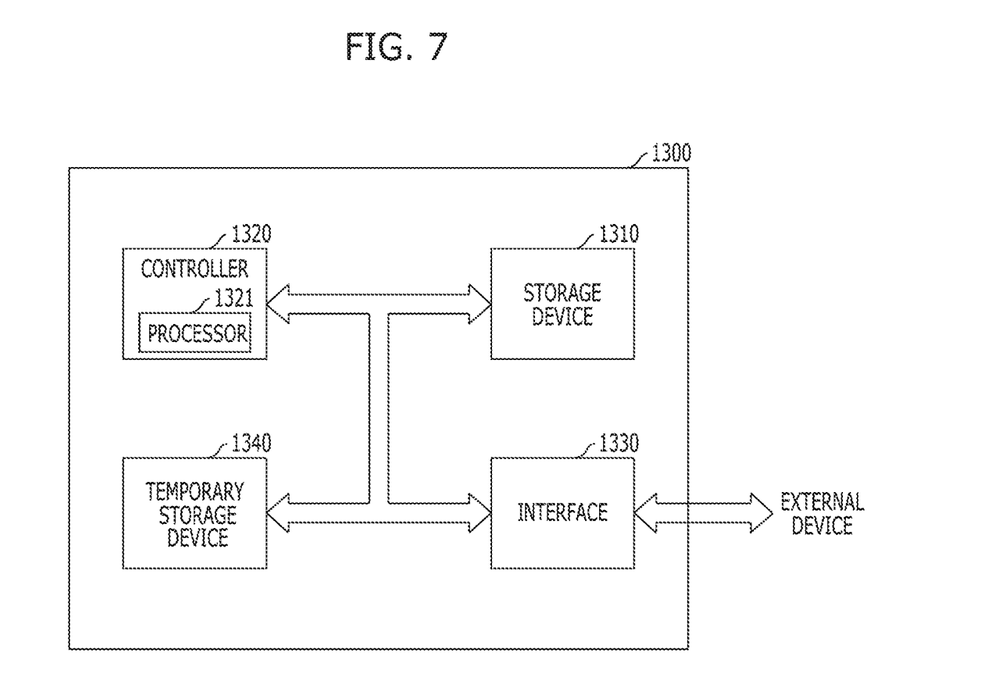
FIG. 7 is an example of configuration diagram of a data storage system implementing memory circuitry based on the disclosed technology.

FIG. 7 is an example of configuration diagram of a data storage system implementing memory circuitry based on the disclosed technology.

Referring to FIG. 7, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. For example, the temporary storage device 1340 may include semiconductor memory which includes a variable resistance element. The variable resistance element may include a free layer having a variable magnetization direction, a tunnel barrier layer formed over the free layer, a pinned layer formed over the tunnel barrier layer and having a pinned magnetization direction, an exchange coupling layer formed over the pinned layer, and a magnetic correction layer formed over the exchange coupling layer. The magnetic correction layer may include a first magnetic layer, a spacer layer and a second magnetic layer which are sequentially stacked, and a saturation magnetization of the first magnetic layer may be smaller than that of the second magnetic layer. Thereby improving characteristics such as thermal stability of the variable resistance element. Therefore, the semiconductor memory with improved operation characteristics may be provided. Through this, the temporary storage device 1340 and the data storage system 1300 may have improved reliability.

Figure 8:
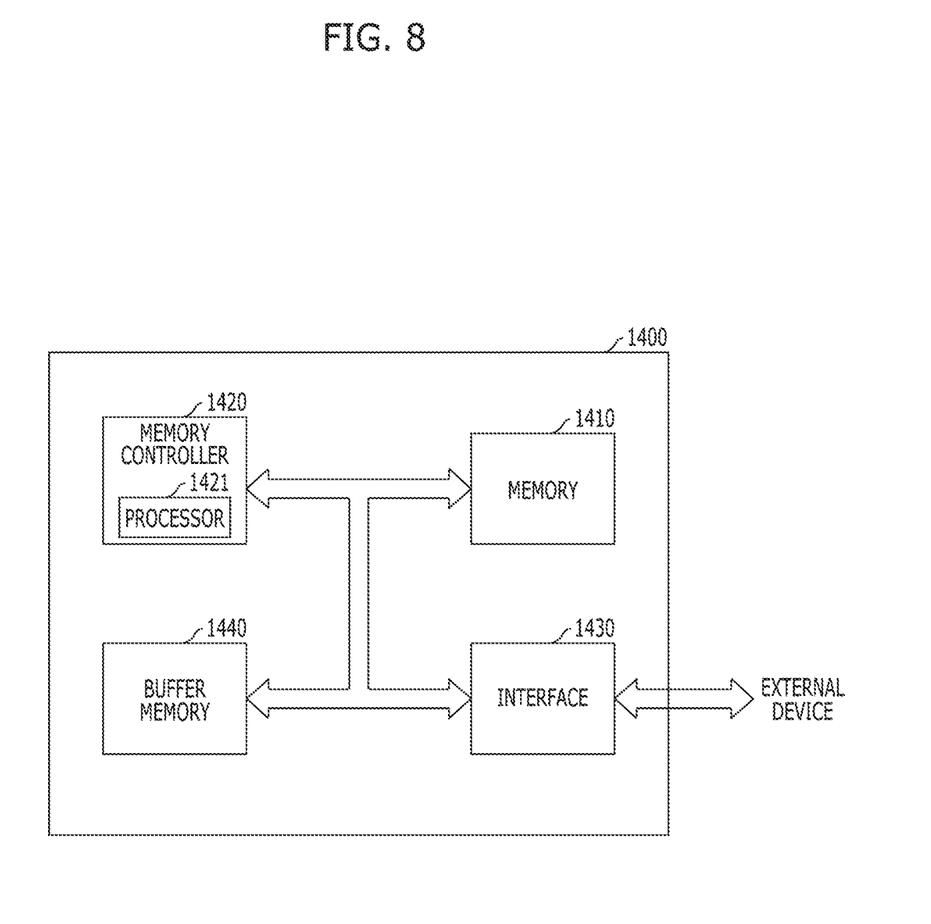
FIG. 8 is an example of configuration diagram of a memory system implementing memory circuitry based on the disclosed technology.

FIG. 8 is an example of configuration diagram of a memory system implementing memory circuitry based on the disclosed technology.

Referring to FIG. 8, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include semiconductor memory which includes a variable resistance element. The variable resistance element may include a free layer having a variable magnetization direction, a tunnel barrier layer formed over the free layer, a pinned layer formed over the tunnel barrier layer and having a pinned magnetization direction, an exchange coupling layer formed over the pinned layer, and a magnetic correction layer formed over the exchange coupling layer. The magnetic correction layer may include a first magnetic layer, a spacer layer and a second magnetic layer which are sequentially stacked, and a saturation magnetization of the first magnetic layer may be smaller than that of the second magnetic layer. Thereby improving characteristics such as thermal stability of the variable resistance element. Therefore, the semiconductor memory with improved operation characteristics may be provided. Through this, the memory 1410 and the memory system 1400 may have improved reliability.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 may include semiconductor memory which includes a variable resistance element. The variable resistance element may include a free layer having a variable magnetization direction, a tunnel barrier layer formed over the free layer, a pinned layer formed over the tunnel barrier layer and having a pinned magnetization direction, an exchange coupling layer formed over the pinned layer, and a magnetic correction layer formed over the exchange coupling layer. The magnetic correction layer may include a first magnetic layer, a spacer layer and a second magnetic layer which are sequentially stacked, and a saturation magnetization of the first magnetic layer may be smaller than that of the second magnetic layer. Thereby improving characteristics such as thermal stability of the variable resistance element. Therefore, the semiconductor memory with improved operation characteristics may be provided. Through this, the buffer memory 1440 and the memory system 1400 may have improved reliability.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 1 to 8 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory, wherein the semiconductor memory comprises:
   a free layer having a variable magnetization direction;
   a tunnel barrier layer formed over the free layer;
   a pinned layer formed over the tunnel barrier layer and having a pinned magnetization direction;
   an exchange coupling layer formed over the pinned layer; and
   a magnetic correction layer formed over the exchange coupling layer,
   wherein the magnetic correction layer comprises a first magnetic layer, a spacer layer and a second magnetic layer that are sequentially stacked, and the first magnetic layer has a saturation magnetization smaller than a saturation magnetization of the second magnetic layer.

2. The electronic device of claim 1, wherein the first magnetic layer and the second magnetic layer have a pinned magnetization direction.

3. The electronic device of claim 2, wherein the first magnetic layer has the same magnetization direction as the second magnetic layer.

4. The electronic device of claim 1, wherein the pinned layer has a magnetization direction fixed to a first direction, and the magnetic correction layer has a magnetization direction fixed to a second direction different from the first direction.

5. The electronic device of claim 1, wherein an SF (synthetic ferromagnet) structure exists between the first magnetic layer and the second magnetic layer, and a SAF (synthetic anti-ferromagnet) structure exists between the magnetic correction layer and the pinned layer.

6. The electronic device of claim 1, wherein the spacer layer comprises the same material as the exchange coupling layer.

7. The electronic device according to claim 1, further comprising a microprocessor which includes:
   a control unit configured to receive a signal including a command from an outside of the microprocessor, and performs extracting, decoding of the command, or controlling input or output of a signal of the microprocessor;
   an operation unit configured to perform an operation based on a result that the control unit decodes the command; and
   a memory unit configured to store data for performing the operation, data corresponding to a result of performing the operation, or an address of data for which the operation is performed,
   wherein the semiconductor memory is part of the memory unit in the microprocessor.

8. The electronic device according to claim 1, further comprising a processor which includes:
   a core unit configured to perform, based on a command inputted from an outside of the processor, an operation corresponding to the command, by using data;
   a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

9. The electronic device according to claim 1, further comprising a processing system which includes:

a processor configured to decode a command received by the processor and control an operation for information based on a result of decoding the command;

an auxiliary memory device configured to store a program for decoding the command and the information;

a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

10. The electronic device according to claim 1, further comprising a data storage system which includes:

a storage device configured to store data and conserve stored data regardless of power supply;

a controller configured to control input and output of data to and from the storage device according to a command inputted form an outside;

a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

11. The electronic device according to claim 1, further comprising a memory system which includes:

a memory configured to store data and conserve stored data regardless of power supply;

a memory controller configured to control input and output of data to and from the memory according to a command inputted form an outside;

a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

12. An electronic device comprising:

a free layer having a variable magnetization direction;

a tunnel barrier layer formed over the free layer;

a pinned layer formed over the tunnel barrier layer and having a magnetization direction fixed to a first direction;

an exchange coupling layer formed over the pinned layer; and a magnetic correction layer formed over the exchange coupling layer, wherein the magnetic correction layer comprises a plurality of magnetic layers, and each of the plurality of magnetic layer having a magnetization direction fixed to a second direction different from the first direction.

13. The electronic device of claim 12, wherein the magnetic correction layer further comprise a spacer layer interposed among the plurality of magnetic layers.

14. The electronic device of claim 13, wherein the spacer layer comprises the same material as the exchange coupling layer.

15. The electronic device of claim 12, wherein each of the plurality of magnetic layers has a different saturation magnetization from each other, and a saturation magnetization of the magnetic correction layer has a linear profile in a vertical direction.

16. The electronic device of claim 15, wherein the saturation magnetization of the magnetic correction layer varies depending on a distance between the magnetic correction layer and the pinned layer.

17. The electronic device of claim 15, wherein the saturation magnetization of the magnetic correction layer is decreased as a distance between the magnetic correction layer and the pinned layer decreases, and is increased as the distance increases.

18. The electronic device of claim 12, wherein an SF (synthetic ferromagnet) structure exists among the plurality of magnetic layers, and a SAF (synthetic anti-ferromagnet) structure exists between the magnetic correction layer and the pinned layer.

19. The electronic device of claim 12, wherein the plurality of magnetic layers includes a first magnetic layer and a second magnetic layer formed over the first magnetic layer, and the second magnetic layer has a saturation magnetization greater than a saturation magnetization of the first magnetic layer.

* * * * *